United States Patent
Sahin et al.

(10) Patent No.: US 6,465,051 B1
(45) Date of Patent: Oct. 15, 2002

(54) METHOD OF OPERATING HIGH DENSITY PLASMA CVD REACTOR WITH COMBINED INDUCTIVE AND CAPACITIVE COUPLING

(75) Inventors: Turgut Sahin, Cupertino; Fred C. Redeker, Fremont; Romuald Nowak, Cupertino; Shijian Li, San Jose; Timothy Dyer, Cupertino; Derek R. Witty, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 1521 days.

(21) Appl. No.: 08/751,899

(22) Filed: Nov. 18, 1996

Related U.S. Application Data

(63) Continuation of application No. 08/234,739, filed on Apr. 28, 1994, now abandoned.

(51) Int. Cl.[7] .............................. H05H 1/46; B05D 3/06; C23C 16/02; C23C 16/517
(52) U.S. Cl. .................. 427/534; 427/535; 427/569; 427/570; 216/68; 216/71; 118/723 MP; 118/723 E; 118/723 I
(58) Field of Search .................. 427/488, 489, 427/490, 491, 534, 535, 536, 537, 538, 539, 569, 570, 571, 572, 573, 574, 575, 576, 577, 578, 579; 156/643.1, 646.1; 216/68, 71; 118/723 MA, 723 AN, 723 E, 723 I

(56) References Cited

U.S. PATENT DOCUMENTS

| | | | |
|---|---|---|---|
| 4,795,529 A | | 1/1989 | Kawasaki et al. |
| 4,795,880 A | * | 1/1989 | Hayes et al. ............. 118/723 I |
| 4,842,683 A | | 6/1989 | Cheng et al. |
| 4,844,775 A | | 7/1989 | Keeble |
| 4,872,947 A | | 10/1989 | Wang et al. |
| 4,948,458 A | | 8/1990 | Ogle |
| 4,992,665 A | | 2/1991 | Möhl |
| 5,122,251 A | | 6/1992 | Campbell et al. |
| 5,149,931 A | * | 9/1992 | Magara .................. 219/69.13 |
| 5,234,529 A | | 8/1993 | Johnson |
| 5,241,245 A | * | 8/1993 | Barnes et al. ........... 315/111.41 |
| 5,277,751 A | | 1/1994 | Ogle |
| 5,280,154 A | | 1/1994 | Cuomo et al. |
| 5,286,297 A | | 2/1994 | Moslehi et al. |
| 5,346,578 A | | 9/1994 | Benzing et al. |
| 5,368,710 A | | 11/1994 | Chen et al. |

FOREIGN PATENT DOCUMENTS

| | | |
|---|---|---|
| EP | 0 379 828 A3 | 8/1990 |
| EP | 0 379 828 A2 | 8/1990 |
| EP | 0 403 418 A2 | 12/1990 |
| EP | 0 520 519 A1 | 12/1992 |
| EP | 0 552 491 A1 | 7/1993 |
| EP | 0 596 551 A1 | 5/1994 |
| GB | 2 231 197 A | 11/1990 |
| WO | WO 92/20833 | 11/1992 |

* cited by examiner

Primary Examiner—Marianne Padgett
(74) Attorney, Agent, or Firm—Michaelson & Wallace

(57) ABSTRACT

The invention is embodied in a method of cleaning a plasma reactor by creating a vacuum in the chamber while introducing an etchant gas into the chamber through the gas injection ports, and applying RF energy to a ceiling electrode in the chamber while not necessarily applying RF energy to the coil antenna, so as to strike a predominantly capacitively coupled plasma in the vacuum chamber. In another embodiment the method includes, whenever the reactor is to be operated in an inductive coupling mode, applying RF power to the reactors coil antenna while grounding the ceiling electrode, and whenever the reactor is to be operated in a capacitive coupling mode, applying RF power to the ceiling electrode, and whenever the reactor is to be cleaned, cleaning the reactor by applying RF power to the ceiling electrode and to the coil antenna while introducing an etchant gas into the vacuum chamber. In yet another embodiment the method includes performing chemical vapor deposition on a wafer by introducing a deposition precursor gas into the chamber while maintaining an inductively coupled plasma therein by applying RF power to the coil antenna while grounding the ceiling electrode, and cleaning the reactor by introducing a precursor cleaning gas into the chamber while maintaining a capacitively coupled plasma in the chamber by applying RF power to the ceiling electrode.

28 Claims, 1 Drawing Sheet

METHOD OF OPERATING HIGH DENSITY PLASMA CVD REACTOR WITH COMBINED INDUCTIVE AND CAPACITIVE COUPLING

This is a continuation, of application Ser. No. 08/234,739, filed Apr. 28, 1994, now abandoned.

RELATED APPLICATIONS

This application is related to U.S. Pat. No. 5,865,896, U.S. Pat. No. 6,220,201 and U.S. Pat. No. 6,364,995 whose patent was concurrently filed by Nowak et al.

BACKGROUND OF THE INVENTION

1. Technical Field

The invention is related to a method of operating a high density plasma CVD reactor having inductive and capacitive coupling modes which can be selected individually or in combination for chamber cleaning operations.

2. Background Art

Plasma reactors used for semiconductor processes such as chemical vapor deposition (CVD), etching, reactive ion etching and so forth typically employ either inductive coupling or capacitive coupling to strike and maintain a plasma. Typically, an etch reactor employs capacitive coupling because the high ion energies characteristic of capacitively coupled plasmas are suitable for removing films such as, for example, silicon dioxide. The high ion energies arise from the high electric fields required to strike a capacitively coupled plasma. For example, as disclosed in European Patent Application publication No. 0 552 491 A1 by Collins et al. entitled "Plasma Etch Process" published Jul. 28, 1993, a capacitively coupled reactor has parallel electrodes, including a pedestal.

However, the plasma density of a capacitively coupled plasma is not sufficient for performing simultaneous chemical vapor deposition (CVD) and in-situ sputtering at low pressures. Accordingly, a CVD plasma reactor of the type disclosed in U.S. patent application Ser. No. 08/113,776 entitled "High Density Plasma CVD and Etching Reactor" filed Aug. 27, 1993 by Fairbairn and Nowak employs inductive coupling to strike and maintain the plasma. In the Fairbairn and Nowak application, a domed-shaped helical coil in a dome-shaped chamber ceiling performs the inductive coupling to the plasma at a low chamber pressure (below 100 milliTorr), the dome shape providing a more uniform ion density distribution across the semiconductor wafer. Such an inductively coupled plasma is characterized by a high ion density and is therefore suitable for low pressure CVD plasma processing at high processing (e.g., deposition) rates.

The main differences between capacitively coupled plasmas and inductively coupled plasmas are the following: An inductively coupled plasma has a plasma density which is up to two orders of magnitude higher, thereby providing higher processing rates. A capacitively coupled plasma has a higher electrode sheet voltage, higher self-biasing and higher plasma impedance, and therefore provides higher sputtering rates and greater risk of damage to the wafer. An inductively coupled plasma exhibits lower ion energy distribution, providing a lower risk of damage to the wafer.

A requirement of all plasma reactors, and especially plasma CVD reactors, is that they must be cleaned periodically to remove deposits and residue. For example, in a CVD reactor, during deposition of silicon dioxide onto a semiconductor wafer, silicon dioxide is deposited onto the chamber walls and ceiling as well as other parts of the reactor chamber, changing the characteristics of the chamber and giving rise to particulate contamination. Therefore, the reactor chamber must be cleaned periodically to remove all such deposits and residue therefrom. Removal of silicon dioxide deposits is accomplished by introducing a fluoride-containing etchant gas such as $NF_3$ (for example) into the chamber and striking a plasma to perform a chamber cleaning operation.

One limitation of inductively coupled plasma reactors is that they require more time to perform a chamber cleaning operation due to their larger volumes, low operational pressure, non-conductive ceilings and lack of bias of the chamber wall surfaces. Certain residues, such as silicon dioxide, typically have relatively low etch rates at low ion energies, and therefore can be difficult to remove by inductively coupled plasmas.

One problem with such a chamber cleaning operation is that the various surfaces of the reactor chamber interior are not cleaned (etched) at the same rate, due to differences in location in the chamber and differences in materials. The plasma density and ion energies are not the same at all locations in the chamber, so that differences in cleaning (etch) rates are quite typical. Moreover, during wafer processing (such as CVD processing), deposits build up more thickly on certain chamber surfaces than on others, so that the deposit or residue thickness is non-uniform throughout the chamber interior. For example, in the etch reactor of the Collins et al. European application referenced above, the etch-process residue is much thicker in the center of the ceiling than at the edge of the ceiling, due to plasma density non-uniformity.

As a result, some metal surfaces are thoroughly cleansed of residue or deposits before others, and the cleaned metal surfaces (e.g., aluminum) are etched while the remaining contaminants are removed from the other still-unclean surfaces. For example, in the case of the flat ceiling electrode of the Collins et al. European application, the edge of the ceiling electrode quickly becomes clean while the center portion still has a thick residue coating remaining thereon. The exposed metal surface of the electrode edge shunts RF energy away from the still-unclean center portion, thereby preventing any further cleaning of the center portion. If a fluoride gas such as $NF_3$ is employed to clean the chamber, the metal surfaces react with the etchant gas during the cleaning operation to form various aluminum fluorides, which re-deposit onto various chamber surfaces, including the ones that are still unclean with other residues or deposits. Such aluminum fluorides etch very slowly or are virtually impervious to being etched (particularly in an inductively coupled plasma), thus masking the prior deposits (e.g., silicon dioxide) underneath. This deposition of aluminum fluorides during the cleaning operation prevents the removal of the remaining residues (e.g., silicon dioxide), so that the reactor chamber cannot be thoroughly cleaned, even by extending the duration of the chamber cleaning operation.

A related problem is that some chamber dielectric surfaces (for example, quartz surfaces) are consumed rapidly during a chamber cleaning operation, particularly in an inductively coupled plasma, and must therefore be frequently replaced at great cost, a significant disadvantage.

SUMMARY OF THE DISCLOSURE

The invention is embodied in a method of operating a plasma reactor having a vacuum chamber, a wafer-holding pedestal near the bottom of the vacuum chamber, gas injection ports and a vacuum pump, a generally planar disk-shaped conductive ceiling electrode at the top of the chamber, a helical coil antenna adjacent the ceiling electrode and a base generally coinciding with a circumference of the vacuum chamber and a switch for individually connecting each one of the coil antenna, the ceiling electrode and the wafer pedestal to any one of (a) a respective RF power source (b) ground or (c) a floating potential (i.e., unconnected), the method including a chamber cleaning operation of removing any wafer from the wafer-holding pedestal, creating a vacuum in the chamber with the vacuum pump while introducing an etchant gas into the chamber through the gas injection ports, and operating the switch so as to apply a RF energy to the ceiling electrode while initially refraining from applying RF energy to the coil antenna, so as to strike a predominantly capacitively coupled plasma in the vacuum chamber.

The invention is also embodied in a method of operating a plasma reactor having a vacuum chamber, a wafer-holding pedestal near the bottom of the vacuum chamber, gas injection ports and a vacuum pump, a generally planar disk-shaped conductive ceiling electrode at the top of the chamber, a helical coil antenna adjacent the ceiling electrode and a base generally coinciding with a circumference of the vacuum chamber and a switch for individually connecting each one of the coil antenna, the ceiling electrode and the wafer pedestal to any one of (a) a respective RF power source, (b) ground or (c) a floating potential, the method including, whenever the reactor is to be operated in an inductive coupling mode, operating the switch so as to apply RF power to the coil antenna while grounding the ceiling electrode, and whenever the reactor is to be operated in a capacitive coupling mode, operating the switch so as to apply RF power to the ceiling electrode, and whenever the reactor is to be cleaned, cleaning the reactor by applying RF power to the ceiling electrode and to the coil antenna while introducing an etchant gas into the vacuum chamber.

The invention is further embodied in a method of operating a plasma chemical vapor deposition reactor having a vacuum chamber, a wafer-holding pedestal near the bottom of the vacuum chamber, gas injection ports and a vacuum pump, a generally planar disk-shaped conductive ceiling electrode at the top of the chamber, a helical coil antenna adjacent the ceiling electrode and a base generally coinciding with a circumference of the vacuum chamber and a switch for individually connecting each one of the coil antenna, the ceiling electrode and the wafer pedestal to any one of (a) a respective RF power source, (b) ground or (c) a floating potential, the method including performing a chemical vapor deposition on a wafer in the pedestal by introducing a deposition precursor gas into the chamber while maintaining an inductively coupled plasma therein by operating the switch so as to apply RF power to the coil antenna while grounding the ceiling electrode, and cleaning the reactor by introducing a precursor cleaning gas into the chamber while maintaining a capacitively coupled plasma in the chamber by operating the switch so as to apply RF power to the ceiling electrode.

DETAILED DESCRIPTION OF THE PREFERRED EMBODIMENTS

Figure 1:
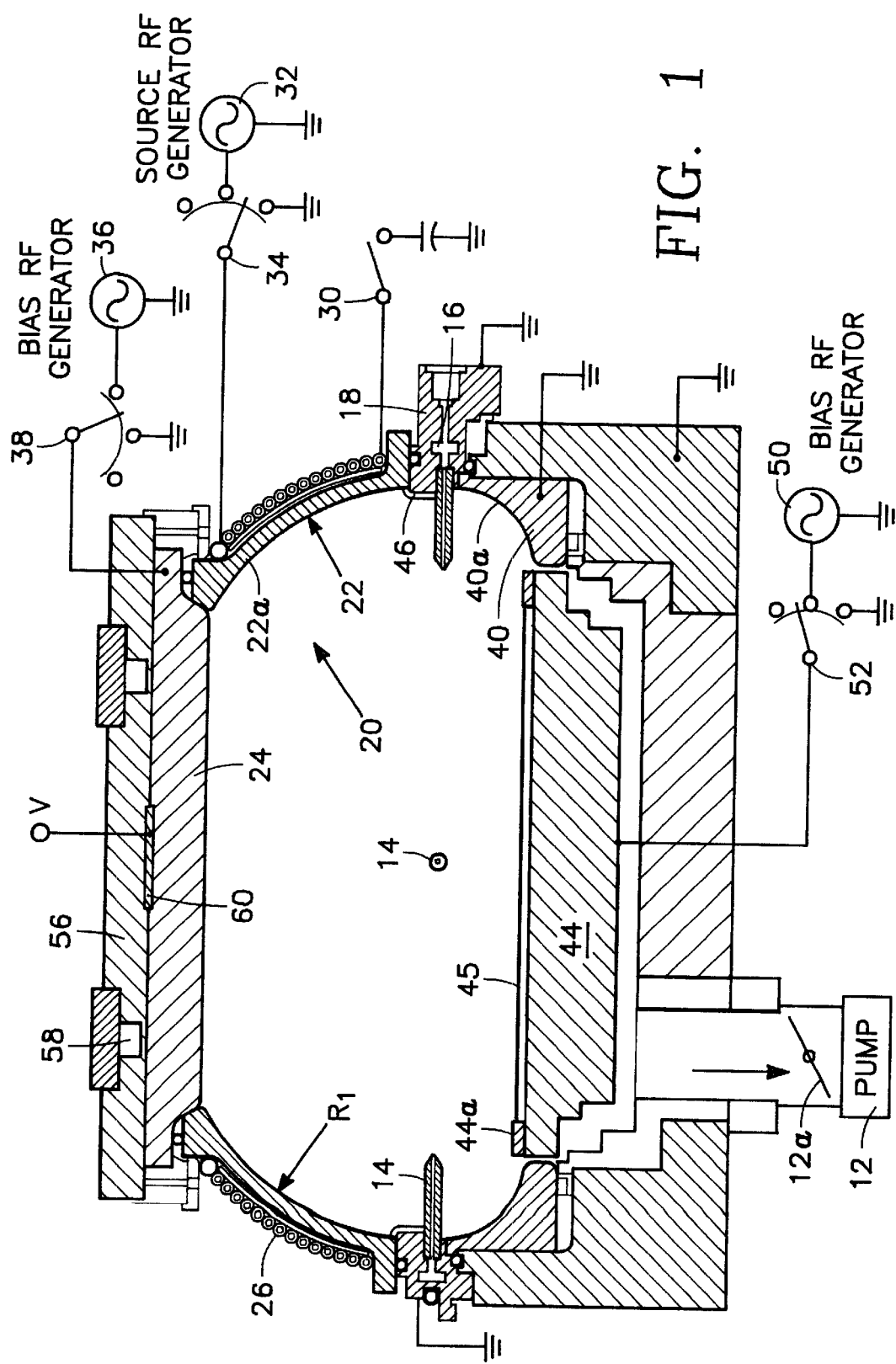
FIG. 1 is a simplified cross-sectional elevational view of a plasma reactor embodying the present invention.

Overview:

In one aspect, the invention employs a plasma reactor chamber having a dome-shaped helically coiled antenna in the side-portion of the ceiling surrounding a planar electrode in the center-portion of the ceiling. Means are provided for separately coupling RF energy to the coil antenna, the ceiling electrode and the wafer pedestal at the bottom of the chamber, so that any one or combination of the ceiling electrode, the coil antenna and the wafer pedestal can receive RF energy or be grounded or be unconnected (float). The coil antenna provides inductive coupling or capacitive coupling or both depending upon the type of plasma required, the ceiling electrode provides capacitive coupling and, when energized simultaneously, the ceiling electrode and coil antenna together provide combined capacitive and inductive coupling to a plasma inside the reactor chamber. During CVD processing, the coil antenna receives RF energy to provide an inductively coupled plasma while the ceiling electrode is grounded and an RF bias is applied to the wafer pedestal. During chamber cleaning operations, RF energy is applied to the ceiling electrode to strike a capacitively coupled plasma while the wafer pedestal is permitted to electrically float (to avoid damage to the wafer pedestal and associated hardware) and the coil antenna is grounded or permitted to float. Once the capacitively coupled plasma has been ignited, RF energy may be applied to the coil antenna to maintain the plasma at a higher plasma density, thus providing additional species and heat to enhance removal of silicon dioxide and similar compounds.

In an alternative embodiment, RF power is applied to the wafer pedestal while a non-production ("dummy") wafer is held on the pedestal, to strike a capacitively coupled plasma to clean the chamber. In this embodiment, the top electrode is preferably either grounded or has RF power applied to it. This method is also applicable using an inductively coupled plasma. The ceiling electrode is preferably heated to a temperature on the order of between approximately 260 and 270 degrees C to increase the chamber cleaning rate.

A capacitive plasma can be ignited by (i) applying RF power to the ceiling electrode alone, (ii) simultaneously applying power to the ceiling electrode and the coil, and (iii) simultaneously applying RF power to the ceiling electrode, the coil and the wafer pedestal. Each of these three different modes provides a unique advantage. Applying power to the ceiling electrode helps clean the grounded surfaces and ceiling surface fast. Applying power to both the ceiling electrode and the coil enhances cleaning of dielectric surfaces while cleaning the metal surfaces fast because of enhanced fluorine dissociation and higher plasma temperature. Applying RF power simultaneously to the ceiling electrode, the coil and the wafer pedestal reduces sputtering of the metal chamber wall surfaces by providing additional ground path(s) to the plasma. Thus, the choice of one of the three modes (i), (ii) and (iii) above may be made in accordance with the distribution of deposited oxide residue in the chamber. A "dummy" wafer may be kept on the wafer pedestal during chamber clean operations to protect the pedestal surface from etching. This is particularly preferred when operating in mode (iii) above.

It is not necessarily required to ground the ceiling electrode in order to ignite either an inductively coupled plasma or a capacitively coupled plasma.

For an inductively coupled plasma, RF power is applied to the coils to ignite the plasma while maintaining a certain pressure level (typically between 30 and 300 milli-Torr depending upon the applied RF power level). Once the plasma is ignited, the pressure may be reduced to less than 30 mTorr to maintain the plasma.

Description of the Reactor Structure:

Referring to FIG. 1, a plasma reactor of the preferred embodiment has a vacuum chamber 10, a vacuum pump 12 and gas injection nozzles 14 connected to a gas supply ring manifold 16 in a metal housing 18 supporting the injection nozzles 14. The chamber 10 has a ceiling 20 consisting of a partial dome-shaped or hemispherical annulus 22 surrounding a planar disk 24. The dome-shaped annulus 22 is an insulator such as quartz or a ceramic. The dome-shaped annulus 22 supports a helically coiled RF antenna 26, one terminal of which is connectable through a capacitor to ground by a switch 30 and the other end of which is connectable to an RF source 32 through a switch 34. The structural details, including the length, of the helically coiled RF antenna 26 is disclosed in the above-referenced U.S. patent application by Fairbairn and Nowak, the disclosure of which is incorporated herein by reference. For example, the RF source 32 includes an RF generator and a conventional RF matching network (not shown).

The ceiling 24 is a conductor which is connectable to either an RF source 36 or ground through a switch 38. The bottom of the chamber 10 may include a removable grounded conductive bottom annular ring or liner 40 which may be doped polysilicon or aluminum and a wafer pedestal 44 for holding a semiconductor wafer 45. Preferably, a dielectric annulus 44a coplanar with the top surface of the wafer 45 surrounds the wafer 45 on the pedestal 44. The wafer pedestal 44 may include an electrostatic chuck, cooling fluid channels and other conventional features not crucial to the present invention. The conductive annular ring 40 has a convex curved interior surface 40a facing the interior of the chamber 10 of approximately the same surface area as the ceiling electrode 24. This feature facilitates capacitive discharge and exposes the chamber bottom ground surfaces toward the plasma. As a result, when an RF source is applied to the ceiling electrode 24 and the annular ring 40 is grounded, both are etched at about the same rate, a significant advantage. The removable ring annulus liner 40 is advantageous for periodic maintainance and chamber bottom cleaning.

As noted previously herein, flat ceiling electrodes (such as the type illustrated in the above-referenced European application of Collins et al.) tend to build up contamination (e.g., silicon dioxide) nonuniformly. In the case of an etch reactor with a flat ceiling, the deposit consists primarily of polymer which tends to deposit more on cooler unbiased surfaces, i.e., the outside edges of the ceiling electrode. In the case of a CVD reactor with a flat ceiling, most of the oxide deposit is located in the center of the ceiling electrode across from the wafer. This is due to the sputtering component of the deposition process induced by RF bias of the wafer pedestal. Consequently, in the CVD reactor, the outer portion of the ceiling electrode clears first during chamber clean, regardless of the plasma discharge mode. In order to overcome this problem, the ceiling electrode 24 of the reactor of the present invention (FIG. 1) is reduced to a size less than the diameter of the side wall (but preferably slightly larger than the wafer pedestal 44), thus eliminating the portion of the ceiling electrode tending to a thinner residue accumulation and therefore to etching or overcleaning.

A related advantage is that the gently curved concave surfaces of the bottom aluminum liner 40 and the quartz dome annulus 22 eliminate sharp corners in the chamber interior which would otherwise be difficult to clean during the chamber clean operation.

Preferably, the materials of the chamber 10 are selected to minimize or eliminate metal surfaces which would otherwise contribute to formation of aluminum fluorides during chamber cleaning operations. Specifically, the ceiling electrode 24 and the bottom annular ring 40 may both be silicon, for example, polysilicon doped to a resistivity less than about 0.2 ohms per centimeter. An advantage of polysilicon is that any silicon removed therefrom during the chamber cleaning (etch) operation is volatile and readily pumped out of the chamber 10. In order to further reduce the possibility of forming aluminum fluoride during chamber cleaning operations, the gas injection nozzles 14 are a ceramic material such as aluminum oxide or aluminum nitride. Moreover, a skirt 46 of quartz, polysilicon, silicon or ceramic covers the metal body 18. Furthermore, the metal body 18 is grounded to reduce the possibility of arcing during chamber cleaning operations. Thus, in the preferred embodiment there are virtually no metal surfaces exposed to the chamber interior. The wafer pedestal 44 is preferably unconnected to any electric potential (i.e., electrically floating) during chamber cleaning operations so that very little etching thereof (or formation of aluminum fluoride therefrom) occurs during chamber cleaning operations.

The wafer pedestal 44 is connectable to ground or an RF source 50, or may be electrically isolated, by a switch 52.

One advantage of the reactor of FIG. 1 is that the coil antenna 26 may be energized simultaneously or after the ceiling electrode 24 has struck a high pressure capacitively coupled plasma in the chamber 10. The advantage of energizing the coil antenna 26 at this point is that it provides an efficient means of maintaining the capacitively coupled plasma and it provides a certain amount of inductive and/or capacitive coupling to the plasma near the quartz annulus 22 so as to etch residues from the quartz annulus 22. This coupling mode causes the quartz material of the annulus 22 to be etched at a rate less than that of a pure low pressure inductively coupled plasma mode, a significant advantage. Furthermore, the inductive coupling provided by the coil antenna 26 generates additional heat in the chamber 10. High temperature greatly enhances the removal of silicon dioxide from the ceiling electrode 24 and other locations in the chamber 10. It should be noted that the ceiling itself serves as a heat sink rather than a heat source because a lid 56 covering the ceiling electrode 24 has cooling jackets 58 running throughout its interior as shown in FIG. 1. The cleaning rate of the ceiling electrode can, however, be accelerated by using an external heat source such as a resistive heater 60 to raise the temperature of the ceiling electrode to between 260 and 270 degrees C, for example.

In one preferred implementation of the reactor of FIG. 1, the radius $R_1$ of curvature of the interior surface 22a of the quartz annulus 22 was 325 cm (13"), the radius of curvature of the interior surface of the bottom ring 40 was 250 cm (9.5"–10"), the diameter D of the ceiling electrode 24 was 225 cm (9"), the diameter of the wafer pedestal 44 was 200 cm (8") and the height of the ceiling electrode 24 from the pedestal 44 was 112 cm (4.5"). However, the invention is not limited to any particular design geometry.

Methods of Operating the Reactor:

The invention, in another aspect, is embodied by certain methods of using the multi-mode coupled plasma reactor of FIG. 1. Basically, the plasma reactor of FIG. 1 has three possible plasma coupling modes: (1) a predominantly inductively coupled plasma, (2) a predominantly capacitively coupled plasma, and (3) a mixture of both inductive and capacitive coupling simultaneously, depending upon the pressure regime, chemistry and applied RF power level.

In order to perform chemical vapor deposition of, for example, silicon dioxide onto a wafer 45 held on the pedestal 44, the reactor is operated in the first mode to provide an inductively coupled plasma. A silicon precursor gas such as silane is introduced into the chamber 10 along with an oxygen-containing gas, using the injection nozzles 14 for the silane. The pump valve 12a is positioned to maintain the chamber pressure at or below 100 milliTorr The ceiling electrode 24 is grounded while 1000–5000 watts of RF energy at between 300 kHz and 14 MHz (preferably 2.0 MHz) is applied from the RF source 32 to the coil antenna 26. The wafer pedestal may be either grounded or floating or an RF bias from the RF source 50 may be applied to the pedestal 44 to generate a suitable plasma sheath voltage over the semiconductor wafer 45 held on the pedestal 44 in accordance with the techniques disclosed in the above-referenced application by Collins et al. and the above-referenced application by Fairbairn and Nowak. In some cases, it may not be necessary to ground the ceiling electrode in order to strike an inductively coupled plasma.

In order to perform a chamber clean operation for a chamber of a volume capable of holding an 8-inch diameter wafer (e.g., between 25 and 30 liters), the chamber pressure is set at between 0.5 and 5 Torr while between 0.5 and 3 liters per minute of a fluorine-containing gas (e.g., $NF_3$, $CF_4$, $C_2F_6$, etc.) and oxygen is pumped into the chamber 10. The wafer pedestal is disconnected and allowed to electrically float by the switch 52, the coil antenna is initially disconnected or grounded by the switches 30, 34 while between 1000 and 5000 watts of RF energy at between 300 kHz and 14 MHz (preferably 1.8 MHz) is applied to the ceiling electrode by the RF source 36 through the switch 38. Once the plasma is struck, the coil antenna 26 may be connected to the RF source 32 by the switch 34 for the following three purposes: (1) the small component of capacitive coupling provided by the coil antenna 26 efficiently maintains the capacitively coupled plasma which has already been struck, (2) the proximity of the coil antenna 26 to the quartz annulus 22 enables etching or cleaning of residue or deposits from the annulus 22 and (3) the inductive coupling of the coil antenna 26 generates heat in the chamber 10, which facilitates the removal of silicon dioxide residues from interior chamber surfaces such as the ceiling electrode 24 and the quartz material around the pedestal.

In order to perform a sputtering or etch operation with purely capacitive coupling, the reactor is operated as described in the preceding paragraph, with the exception that the coil antenna remains disconnected or grounded throughout. The capacitive coupling mode provides much faster etch rates because it is characterized by plasma sheath voltages on the order of 50 volts, while the inductive coupling mode is characterized by plasma sheath voltages on the order of only 5 volts.

Following the above-described chamber clean operation, adsorbed fluorine atoms need to be removed from the chamber interior. For this purpose, a hydrogen-containing plasma is struck in the chamber 10 in the same manner as described with reference to the chamber cleaning operation, with the exception that hydrogen gas (or a hydrogen-containing gas such as silane) is substituted for the $NF_3$ gas.

The capacitive discharge mode is more favorable for chamber cleaning due to a higher voltage drop across the sheet in the vicinity of surface to be cleaned. This results in a higher energy of the ions impinging on the surface, thus facilitating breakdown of the silicon-oxide bond. However, the reactor may be cleaned in either regime, capacitive or inductive coupling. Matching of cleaning rates in different areas of the reactor can be achieved by proper clean regime selection. In fact, a two step clean process may be employed consisting of an inductive mode plasma clean step followed by an capacitive mode plasma clean step. Alternatively, the order of these two steps may be reversed.

In the capacitive clean mode the pressure has to be relatively high (greater than 0.5 Torr) to prevent excessive sputtering of the chamber walls. In the low pressure regime, plasma coupling is primarily inductive and minimal wall surface biasing occurs. The inductive discharge mode leads, however, to generally higher plasma temperatures. A capacitively coupled plasma is very efficient for cleaning the electrodes. It is the inductive enhancement of the generally capacitively coupled plasma described above that helps to clean the quartz dome and other areas of the chamber not directly biased by the capacitive discharge.

The wafer pedestal can be biased, grounded or floating. It is beneficial to be able to so control the pedestal potential in order to either clean the pedestal from residues or, alternatively, to protect it from overcleaning and damage.

A key advantage of the chamber cleaning process described above is that for a given reactor temperature the cleaning process is five to ten times faster than the cleaning process for an inductively coupled high density plasma reactor of the type described in the above-referenced application by Fairbairn and Nowak.

While the invention has been described with reference to a preferred embodiment in which separate individual RF sources are furnished for the ceiling electrode 24 and the coil antenna 26, the coil antenna and the ceiling electrode may be connected together to a common RF source whenever both are to receive RF energy simultaneously.

Other methods of using the reactor of FIG. 1 are useful. By adjusting the ratio of RF power applied to the ceiling electrode 24 and the coil antenna 26, the reactor of FIG. 1 may be operated in a broad pressure range from below 10 milliTorr to 15 Torr, the lower pressure regimes favoring a predominantly inductively coupled plasma and the high pressure regimes favoring a predominantly capacitively coupled plasma.

While the invention has been described in detail by specific reference to preferred embodiments, it is understood that variations and modifications thereof may be made without departing from the true spirit and scope of the invention.

What is claimed is:

1. A method of operating a plasma reactor having a vacuum chamber, a wafer-holding pedestal capable of supporting a wafer adjacent the bottom of said vacuum chamber, gas inlets, and a vacuum pump, a generally planar conductive ceiling electrode at the top of said chamber, a coil antenna disposed around a space between said ceiling electrode and said wafer-holding pedestal, and switches for individually connecting each one of said coil antenna, said ceiling electrode and said wafer pedestal to at least one of (a) a first RF power source, (b) ground, (c) a floating potential, (d) a second RF power source, said method including a chamber cleaning operation comprising steps of:

creating a capacitively coupled plasma processing pressure level in said chamber with said vacuum pump while introducing an etchant gas into said chamber through said gas inlets;

creating a capacitively coupled plasma in said chamber by operating a first one of said switches so as to apply RF energy to said ceiling electrode by connecting said ceiling electrode to said first RF power source;

initially, operating a second one of said switches so as to connect said coil antenna to one of (a) said ground, (b) said floating potential; and after said capacitively coupled plasma has been created, operating said second one of said switches so as to apply RF energy to said coil antenna by connecting said coil antenna to said second RF power source.

2. The method of claim 1 further comprising operating, at least initially, a third one of said switches so as to connect said wafer pedestal to one of (a) ground, (b) said floating potential.

3. The method of claim 1 wherein a third one of said switches additionally has a capability to connect said wafer pedestal to a third RF power supply, the method further comprises operating said third one of said switches so as to apply RF energy to said wafer pedestal by connecting said pedestal to said third RF power source.

4. The method of claim 1 wherein said capacitively coupled plasma Processing pressure level is in the range of between about 0.5 and 10 Torr.

5. The method of claim 1 wherein said RF energy applied to said ceiling electrode is characterized by a power level in the range of between about 1000 and 3000 watts at a frequency between about 300 kHz and 14 MHz.

6. The method of claim 1 wherein said etchant gas is of the class of gases comprising at least one of nitrogen fluorides, silicon fluorides and carbon fluorides and wherein a flow rate of said etchant gas into said chamber is in the range between about 0.5 and 3 liters per minute.

7. The method of claim 1 wherein the RF energy applied to said coil antenna is characterized by a power level on the order of between about 1000 and 3000 watts and a frequency of between about 300 kHz and 14 Mhz.

8. The method of claim 6 further comprising removing said etchant gas from said chamber and introducing a hydrogen-containing gas into said chamber so as to strike a hydrogen plasma, whereby to remove fluorine residue from said chamber left behind by said etchant gas.

9. The method of claim 1 further including a wafer processing operation performed at a completion of said chamber cleaning operation, comprising:
   removing said etchant gas from said chamber and placing a wafer to be processed onto said wafer pedestal;
   introducing a processing gas into said vacuum chamber while changing said capacitively coupled plasma processing pressure level to an inductively coupled plasma processing pressure level;
   operation said first one of said switches so as to connect said ceiling electrode to ground;
   if said coil antenna is not connected to said second RF power supply, operation said second one so said switches so to apply RF energy to said coil antenna by connecting the coil antenna to the second RF power supply, thereby striking an inductively coupled plasma; and
   operating a third one so said switches, which has the capability to connect said wafer pedestal to a third RF power supply, so as to apply RF energy to said wafer pedestal by connecting said pedestal to said third RF power source.

10. The method of claim 9 wherein said wafer processing operation comprises a chemical vapor deposition process and wherein said processing gas is a precursor gas of a material to be deposited onto said wafer.

11. The method of claim 10 wherein said inductively coupled plasma processing pressure level is not more than about 100 milliTorr.

12. The method of claim 10 wherein said RF energy applied to said coil antenna is characterized by a power level of between about 1000 and 3000 watts at a frequency of between about 300 kHz and 14 MHz.

13. The method of claim 1 further comprising a wafer processing operation performed at a completion of said chamber cleaning operation, comprising:
   removing said etchant gas from said chamber and placing a wafer to be processed onto said wafer pedestal;
   introducing a processing gas into said vacuum chamber;
   operating said second one of said switches so as to connect said coil antenna to ground;
   if said ceiling electrode is not connected to said first RF power supply, operating said first one of said switches so as to apply RF energy to said ceiling electrode by connecting the ceiling electrode to the first RF power supply, thereby striking a capacitively coupled plasma; and
   operating a third one of said switches, which has the capability to connect said wafer pedestal to a third RF power supply, so as to apply RF energy to said wafer Pedestal by connecting said pedestal to said third RF power source.

14. The method of claim 13 wherein said capacitively coupled plasma processing pressure level is in the range of between about 0.5 and 10 Torr.

15. The method of claim 13 wherein said RF energy applied to said ceiling electrode is characterized by a power level of between about 1000 and 3000 watts at a frequency of about 1.8 MHz.

16. The method of claim 1 further comprising a step of heating said ceiling electrode to accelerate said chamber cleaning operation.

17. The method of claim 16 wherein said heating step comprises heating said ceiling electrode to between about 260 and 270 degrees Celsius.

18. The method of claim 1 further comprising installing a dummy wafer on said wafer-holding pedestal so as to protect the pedestal during said chamber cleaning operation.

19. The method of claim 1 further comprising adjusting the pressure level within the chamber, and adjusting a ratio between a first RF power level applied to said ceiling electrode by said first RF power source and a second RF power level applied to said coil antenna by said second RF power source, so as to coordinate a first rate of cleaning of a first region of the chamber affected by cleaning capabilities of the ceiling electrode with a second rate of cleaning of a second region of the chamber affected by cleaning capabilities of the coil antenna.

20. A method of operating a plasma chemical vapor deposition reactor having a vacuum chamber, a wafer-holding pedestal adjacent the bottom of said vacuum chamber, gas injection ports and a vacuum pump, a generally planar conductive ceiling electrode at the top of said chamber, a coil antenna disposed about a space between said ceiling electrode and said wafer-holding pedestal, and switches for individually connecting each one of said coil antenna, said ceiling electrode and said wafer pedestal to at least one of (a) a first RF power source, (b) ground, (c) a floating potential, (d) a second RF power source, said method comprising steps of:
   performing a chemical vapor deposition on a wafer on said pedestal by introducing a deposition precursor gas into said chamber while maintaining an inductively coupled plasma therein by operating a first one of said switches so as to apply RF power to said coil antenna by connecting said antenna to said first RF power source, while operating a second one of said switches so as to ground said ceiling electrode;
   cleaning said reactor following said step of performing the chemical vapor deposition by introducing a precursor cleaning gas into said chamber while maintaining a capacitively coupled plasma in said chamber by operating said second one of said switches so as to apply RF power to said ceiling electrode by connecting said electrode to said second RF power source, while initially operating, during the cleaning step, said first one of said switches so as to connect said coil antenna to one of (a) said ground, (b) said floating potential; and after the capacitively coupled plasma has been created, operating said first one of said switches so as to apply RF power to said coil antenna by connecting said antenna to said first RF power source.

21. The method of claim 20 wherein said step of cleaning further comprises, operating a third one of said switches so as to connect said wafer-holding pedestal to said floating potential to protect said pedestal from etching during said cleaning step.

22. The method of claim 20 wherein a third one of said switches additionally has a capability to connect said wafer pedestal to a third RF power supply, and wherein said step of cleaning further comprises, operating said third one of said switches so as to apply RF power to said wafer-holding pedestal of by connecting said pedestal to said third RF power source.

23. A method of operating a plasma reactor having a vacuum chamber, a wafer-holding pedestal capable of supporting a wafer adjacent the bottom of said vacuum chamber, gas inlets, and a vacuum pump, a generally planar conductive ceiling electrode at the top of said chamber, a coil antenna disposed around a space between said ceiling electrode and said wafer-holding pedestal, and switches for individually connecting each one of said coil antenna, said ceiling electrode and said wafer pedestal to at least one of (a) a first RF power source, (b) a second RF power source, (c) ground, (d) a floating potential, said method including a chamber cleaning operation comprising steps of:

first, creating a vacuum pressure in said chamber with said vacuum pump while introducing an etchant gas into said chamber through said gas inlets;

second, operating a first one of said switches so as to apply RF energy to said coil antenna by connecting said antenna to said first RF power source;

third, operating a second one of said switches so as to connect said ceiling electrode to one of (a) said ground, (b) said floating potential;

fourth, operating said first one of said switches so as to connect said coil antenna to one of (a) said ground, (b) said floating potential; and fifth, operating said second one of said switches so as to apply RF energy to said ceiling electrode by connecting said electrode to said second RF power source.

24. The method of claim 23 wherein the step of creating the vacuum pressure in said chamber comprises.

creating a first pressure level not more than about 100 milliTorr during a period of time when RF energy is applied to said coil antenna; and creating a second pressure level in a range of between about 0.5 and 10 Torr during a period of time when RF energy is applied to said ceiling electrode.

25. A method of operating a plasma reactor having a vacuum chamber, a wafer-holding pedestal capable of supporting a wafer adjacent the bottom of said vacuum chamber, gas inlets, and a vacuum pump, a generally planar conductive ceiling electrode at the top of said chamber, a coil antenna disposed around a space between said ceiling electrode and said wafer-holding pedestal, and switches for individually connecting each one of said coil antenna, said ceiling electrode and said wafer pedestal to at least one of (a) a first RF power source, (b) a second RF power source, (c) ground, (d) a floating potential, said method including a chamber cleaning operation comprising steps of:

first, creating a vacuum pressure in said chamber with said vacuum pump while introducing an etchant gas into said chamber through said gas inlets;

second, operating a first one of said switches so as to apply RF energy to said ceiling electrode by connecting said electrode to said first RF power source;

third, operating a second one of said switches so as to connect said coil antenna to one of (a) ground, (b) said floating potential;

fourth, operating said first one of said switches so as to connect said ceiling electrode to one of (a) ground, (b) said floating potential; and fifth, operating said second one of said switches so as to apply RF energy to said coil antenna by connecting said antenna to said second RF power source.

26. The method of claim 25 wherein the step of creating the vacuum pressure in said chamber comprises:

creating a first pressure level in a range of between about 0.5 and 10 Torr during a period of time when RF energy is applied to said ceiling electrode; and creating a second pressure level not more than about 100 milliTorr during a period of time when RF energy is applied to said coil antenna.

27. A method of operating a plasma reactor having a vacuum chamber, a wafer-holding pedestal capable of supporting a wafer adjacent the bottom of said vacuum chamber, gas inlets, and a vacuum pump, a generally planar conductive ceiling electrode at the top of said chamber, a coil antenna disposed around a space between said ceiling electrode and said wafer-holding pedestal, and switches for individually connecting each one of said coil antenna, said ceiling electrode and said wafer pedestal to at least one of (a) a RF power source, (b) ground, (c) a floating potential, said method including a chamber cleaning operation comprising steps of:

creating a capacitively coupled plasma processing pressure level in said chamber with said vacuum pump while introducing an etchant gas into said chamber through said gas inlets;

creating a capacitively coupled plasma in said chamber by operating a first one of said switches so as to apply RF energy to said ceiling electrode by connecting said ceiling electrode to said RF power source;

initially, operating a second one of said switches so as to connect said coil antenna to one of (a) said ground, (b) said floating potential; and after said capacitively coupled plasma has been created, operating said second one of said switches so as to apply RF energy to said coil antenna by connecting said coil antenna to said RF power source.

28. The method of claim 27 wherein the RF energy is characterized by a power level on the order of between about 1000 and 3000 watts and a frequency of between about 300 kHz and 14 Mhz.

* * * * *